(12) United States Patent
Britton et al.

(10) Patent No.: US 9,029,180 B2
(45) Date of Patent: May 12, 2015

(54) PRINTED TEMPERATURE SENSOR

(75) Inventors: David Thomas Britton, Cape Town (ZA); Margit Harting, Cape Town (ZA)

(73) Assignee: PST Sensors (Proprietary) Limited, Cape Town (ZA)

( * ) Notice: Subject to any disclaimer, the term of this patent is extended or adjusted under 35 U.S.C. 154(b) by 0 days.

(21) Appl. No.: 13/822,965

(22) PCT Filed: Sep. 13, 2011

(86) PCT No.: PCT/IB2011/054001
§ 371 (c)(1),
(2), (4) Date: Apr. 22, 2013

(87) PCT Pub. No.: WO2012/035494
PCT Pub. Date: Mar. 22, 2012

(65) Prior Publication Data
US 2013/0203201 A1 Aug. 8, 2013

(30) Foreign Application Priority Data

Sep. 13, 2010 (ZA) .................................. 2010/6532

(51) Int. Cl.
| | |
|---|---|
| *H01L 21/00* | (2006.01) |
| *H01L 35/34* | (2006.01) |
| *G01K 7/22* | (2006.01) |
| *H01C 7/04* | (2006.01) |
| *H01C 17/06* | (2006.01) |

(52) U.S. Cl.
CPC ................ *H01L 35/34* (2013.01); *G01K 7/226* (2013.01); *H01C 7/04* (2013.01); *H01C 7/041* (2013.01); *H01C 17/06* (2013.01)

(58) Field of Classification Search
None
See application file for complete search history.

(56) References Cited

U.S. PATENT DOCUMENTS

| | | | |
|---|---|---|---|
| 4,200,970 A | 5/1980 | Schonberger | |
| 4,415,607 A | 11/1983 | Denes et al. | |
| 4,874,924 A | 10/1989 | Yamamoto et al. | |
| 5,363,084 A | 11/1994 | Swinehart | |
| 5,622,652 A | 4/1997 | Kucherovsky et al. | |
| 5,758,575 A | 6/1998 | Isen et al. | |
| 5,763,058 A | 6/1998 | Isen et al. | |
| 6,010,771 A | 1/2000 | Isen et al. | |
| 2001/0055231 A1* | 12/2001 | Tsuruta ......................... | 365/202 |
| 2004/0098216 A1 | 5/2004 | Ye et al. | |

(Continued)

FOREIGN PATENT DOCUMENTS

| | | |
|---|---|---|
| AT | 369186 | 12/1982 |
| BE | 865.852 | 7/1978 |

(Continued)

*Primary Examiner* — Asok K Sarkar
(74) *Attorney, Agent, or Firm* — Frommer Lawrence & Haug LLP; Ronald R Santucci (57) ABSTRACT

A method of producing a temperature sensing device is provided. The method includes forming at least one silicon layer and at least one electrode or contact to define a thermistor structure. At least the silicon layer is formed by printing, and at least one of the silicon layer and the electrode or contact is supported by a substrate during printing thereof. Preferably, the electrodes or contacts are formed by printing, using an ink comprising silicon particles having a size in the range 10 nanometers to 100 micrometers, and a liquid vehicle composed of a binder and a suitable solvent. In some embodiments the substrate is an object the temperature of which is to be measured. Instead, the substrate may be a template, may be sacrificial, or may be a flexible or rigid material. Various device geometries are disclosed.

26 Claims, 6 Drawing Sheets

(56) References Cited

U.S. PATENT DOCUMENTS

| | | |
|---|---|---|
| 2004/0148120 A1 | 7/2004 | Ye et al. |
| 2004/0153279 A1 | 8/2004 | Ye et al. |
| 2004/0162692 A1 | 8/2004 | Ye et al. |
| 2004/0230396 A1 | 11/2004 | Ye et al. |
| 2005/0125184 A1 | 6/2005 | Ye et al. |
| 2006/0199313 A1 | 9/2006 | Harting et al. |
| 2007/0234918 A1 | 10/2007 | Hirahara et al. |
| 2011/0318905 A1* | 12/2011 | Chiruvolu et al. ............ 438/478 |
| 2013/0016756 A1* | 1/2013 | Wolkin et al. .................. 374/31 |

FOREIGN PATENT DOCUMENTS

| | | | |
|---|---|---|---|
| BR | 8801903 | A | 4/1988 |
| CA | 1 101 128 | A | 5/1981 |
| CA | 2 224 147 | A | 12/1996 |
| CA | 2 224 236 | A | 4/1997 |
| CH | 631 569 | A | 8/1982 |
| CN | 1030508 | A | 1/1989 |
| DE | 28 15 003 | A | 10/1978 |
| EP | 0 290 159 | A | 11/1988 |
| EP | 1 841 301 | A | 10/2007 |
| ES | 468.765 | A | 4/1978 |
| FR | 2 423 848 | A | 11/1979 |
| GB | 1 601 853 | | 11/1981 |
| GR | 780164137 | B | 8/1980 |
| IL | 54413 | A | 12/1979 |
| JP | 53-128753 | | 11/1978 |
| JP | 63-167696 | U | 11/1988 |
| JP | 1-79292 | U | 5/1989 |
| JP | 2006-505940 | A | 2/2006 |
| JP | 2006-516819 | A | 7/2006 |
| JP | 2007-300077 | A | 11/2007 |
| KR | 10-2007-0098648 | | 10/2007 |
| KR | 10-2009-0024771 | | 3/2009 |
| LU | 79425 | | 7/1979 |
| NL | 7804020 | A | 10/1978 |
| SE | 78041993 | | 4/1978 |
| WO | WO 96/40522 | A | 12/1996 |
| WO | WO 97/14157 | A | 4/1997 |
| WO | WO 2004/042791 | A | 5/2004 |
| WO | WO 2004/068536 | A | 8/2004 |
| WO | WO 2007/004014 | A | 1/2007 |
| WO | WO 2007/023362 | A | 3/2007 |
| WO | WO 2007/072162 | A | 6/2007 |
| WO | WO 2009/125370 | A | 10/2009 |

\* cited by examiner

PRINTED TEMPERATURE SENSOR

This application is a 371 of PCT/IB2011/054001 filed on Sep. 13, 2011, published on Mar. 22, 2012 under publication number WO 2012/035494 A and claims priority benefits of South African Patent Application Number 2010/06532 filed Sep. 13, 2010, the disclosure of which is incorporated herein by reference.

BACKGROUND OF THE INVENTION

THIS invention relates to a temperature sensing device and a method of producing such devices. In particular the invention relates to a negative temperature coefficient thermistor.

Printing of functional inks has a long tradition in the electronics field. For example, pigment based inks are used to screen-print interconnections and resistors on printed circuit boards. In these applications the thick film inks used consist of a vehicle and pigments of silver and carbon respectively, where the pigment particles can have a dimension in the nanometer range.

Traditionally most functional materials have been printed by conventional printing techniques, such as screen printing. More recent developments are aimed at printing not only the passive components of a circuit, but also active components. For example, printed nanoparticulate silicon components are disclosed in International patent application WO 2004/068536, which discloses the printing of semiconducting layers in active devices like solar cells and transistors. However, a commonly known example for an application of semiconducting thick-film pastes is the fabrication of a temperature dependent resistor, known as a thermistor. Such devices are generally considered to be passive electronic components. Of particular relevance here are thermistors which have a negative temperature coefficient of resistance, commonly known as NTC thermistors, meaning that their electrical resistance decreases approximately exponentially with increasing temperature.

Existing thermistors of this general type are composed of pastes comprised of a powder of a compound semiconductor material and a binder material, such as a glass frit. This paste is either screen printed onto a ceramic substrate or cast to form a green body, after which it is sintered at high temperature to form a massive layer or body of semiconductor material. Invariably, because of distortion during the thermal treatment, further trimming of the material to obtain the correct resistance is required before metallization, in the case of thick-film thermistors.

The fabrication processes used place limitations on the substrate materials that can be used, precluding the use of many lightweight, flexible materials such as paper and polymer film. Traditionally, thick-film inks used for the fabrication of thermistors are composed of heavy metal sulphides and or tellurides, such as lead sulphide, and are not compliant with modern legislation such as the European Restriction on Hazardous Substances (ROHS). Recently introduced alternative materials include compositions of mixtures of rare earth and transition metal oxides, such as manganese oxide. Thermistors based on silicon are usually cut from heavily doped silicon wafers, and have a positive temperature coefficient of resistance.

It is an object of the invention to provide an alternative temperature sensing device and a method of producing such devices.

SUMMARY OF THE INVENTION

According to the invention there is provided a method of producing a temperature sensing device, the method including forming at least one silicon layer and at least two conducting electrodes or contacts to define a thermistor structure, at least the silicon layer being formed by printing, and at least one of the silicon layer and conducting electrodes or contacts being supported by a substrate material during printing thereof.

The temperature sensing device may be a negative temperature coefficient (NTC) thermistor.

For the purposes of the invention, "printing" should be interpreted in its broadest sense as any method of depositing a liquid or colloidal mixture on a solid substrate, and hence includes coating methods such as drop casting, slit coating, spin coating and spraying.

Although direct patterning, by printing a design or coating through a stencil is desirable, this is not necessary if the substrate material has the correct size and form.

Specifically the definition of printing should include all types of: relief printing, including but not limited to flexography and letterpress; intaglio processes such as gravure printing; and planographic printing, such as lithography, xerography, and thermography.

Planographic printing methods envisaged include all offset printing processes in which the design is first transferred to a blanket roll, such as offset lithography and offset gravure printing, or to a tampon as in pad printing.

Finally, the term printing should encompass traditional stencil methods which are commonly defined as printing, and screen printing in particular, as well as non-contact printing methods such as ink-jet printing, aerosol, spraying, and electrohydrodynamic spraying.

At least the silicon layer, and preferably the electrodes or contacts, should be deposited by printing as defined above.

Said at least one silicon layer and at least two conducting electrodes or contacts may be applied directly to an object of which the temperature is to be measured, so that the object itself forms the substrate.

Alternatively the substrate may be any metallic, or otherwise electrically conducting body, such that the substrate forms one of the contacts for the thermistor.

Otherwise the substrate can be any material or combination of materials upon which the contacts and the silicon layer can be deposited.

In one preferred embodiment, the substrate comprises a flexible sheet, which may for example be composed of a solid film such as a metal foil or polymer sheet; a fibrous material such as paper and felted materials; or a woven fabric.

In the case of a metallic or conducting substrate which does not form one of the contacts to the device, the surface of the substrate may be rendered non-conducting by the application of an intermediate insulating layer, either in the form of a paint, ink, varnish or lacquer, or through commonly known surface treatment processes such as oxidation, carburization, nitridation or anodizing.

In another preferred embodiment the substrate comprises a rigid sheet, which may be composed of a solid material such as a metal sheet, glass or polymer sheet or semiconductor wafer; a composite containing fibrous or particulate material such as paper and felted materials; or a composite containing woven fabric.

By way of example only, possible materials from which the substrate can be composed include copper, aluminium, gold, silver, alloys thereof, silicon, germanium, silicon carbide, flint glass, crown glass, borosilicate glass, quartz, paper card, cotton, glass fibre, polyimide, polyester and its derivatives, other plastics, cellulose, and many other materials.

Where the body for which the temperature to be measured does not form the substrate, the substrate may form a permanent support for the thermistor structure.

Alternatively the substrate may form a temporary support or template for the thermistor structure during the production thereof.

In this case, the substrate may either be sacrificial, and be removed by chemical, thermal or mechanical means after printing of the thermistor structure, or it may form a reusable template.

In a preferred embodiment the silicon layer is formed from an ink comprising silicon particles and a liquid vehicle composed of a binder and a suitable solvent. In some cases, depending on the printing process, the solvent may be omitted, or additional compounds commonly used in the formulation of inks, such as siccatives or stabilisers, may be added.

The silicon particles should have a size in the range 10 nanometers to 100 micrometers, and preferably should be nanoparticles with a characteristic size between 50 and 250 nanometers.

The silicon nanoparticles should preferably have a surface which allows the transport of electrical charge between particles. This may be achieved through a suitable termination of surface dangling bonds by oxygen, hydroxyl or hydrogen species as described in International patent application WO 2007/004014.

Electrical conduction through the silicon nanoparticle network formed within the printed silicon layer is presumed to occur by a hopping percolation process, in which the transfer of charge between the individual particles or clusters of particles, or the semiconductor material and the conducting electrode, is limited by thermally activated processes. Hence the temperature coefficient of the resistance is predominantly determined by the particle characteristics, especially at their surfaces and interfaces. Modification of the surface, either by the introduction or removal of trapped states by the adsorption of other species, particularly small molecules which are easily ionized; or the varying of the thickness of an interfacial barrier caused by partial oxidation or adsorption of another material, specifically large organic molecules, can therefore also be used to alter the temperature response of the material.

Another mechanism known to contribute to the temperature dependence of the resistance is the thermal generation of carriers in intrinsic or lightly doped semiconductors. It is therefore desirable to choose the appropriate doping level of the silicon particles, either by fabricating them from conventionally doped n- and p-type material or adsorbing a fully ionized ionic species onto the surface as described in International patent application WO 2007/023362.

Suitable silicon nanoparticles can be produced by mechanical attrition of bulk silicon, or by any other method, such as the pyrolysis of any silane gas, including monosilane and disilane and their derivatives, in which full oxidation is prevented by the exclusion of oxygen, or the reduction of the sub-stoichiometric oxides as described in International patent application WO 2009/125370.

The overall transport of electrical current through the silicon layer follows a percolation path between interconnecting particles and clusters of particles. Therefore the nominal, or room temperature, resistivity is chiefly governed by the microstructure of the silicon layer, and particularly the number of particle interconnections. This can be modified not only by the choice of printing process and its parameters, but by the modification of the ink composition, through variation of the silicon to binder ratio or the addition of either an insulating phase such as silica or other ceramic nanoparticles, or conducting metallic nanoparticles.

The method may include the addition of at least one additional conducting path into the silicon particle layer by the modification of the ink composition, by varying the silicon to binder ratio, or the addition of either an insulating phase such as silica or other ceramic nanoparticles, or a conducting or semiconducting phase to the ink, thereby effectively to add a relatively temperature independent internal resistance in parallel with the temperature dependent resistance of the thermistor structure.

The addition of extra conducting paths into the silicon particle layer has the effect of adding a relatively temperature independent internal resistance in parallel with the temperature dependent material of the thermistor structure. This combination may also be used to modify the temperature sensitivity of the device.

In an extension of this idea, the additional phase may comprise nanoparticles of differently doped silicon, or of another semiconductor material.

In an alternative approach, a printed temperature sensor may be fabricated with an internal temperature independent resistor printed, using a conducting ink, in parallel with the temperature dependent resistance of the thermistor structure.

Similarly the nominal resistance of the printed temperature sensor can be increased by printing a temperature independent internal resistance in series with the temperature dependent resistance of the thermistor structure.

The silicon powder to binder ratio in the inks used should be sufficient to allow a measurable electrical conductance in the nominal operating range of the device, but low enough to maintain structural integrity of the silicon layer.

The nanoparticle fraction in the ink may range from 5% to 95%, but best performance is achieved above when the concentration of nanoparticles is significantly greater than the lower percolation thresholds, with a practical limit of around 25%.

Between the lower and upper percolation thresholds, the resistance may be simply adjusted by variation of the fraction of silicon nanopowder in the ink. Our results show this region to broadly correspond to between 25% and 60% of silicon nanopowder particles in the ink by volume.

The best reproducibility is obtained for high particle to binder ratios, above the higher percolation threshold where the material properties vary only weakly with the fraction of silicon in the ink. This can be achieved with a silicon fraction above 60% and preferably in excess of 80%.

The ink vehicle may be comprised of any commonly used ink-base, composed of an organic binder and its appropriate solvent.

The binder may be a soluble polymer such as polystyrene or cellulose acetate butyrate, or an autopolymerising monomer such as acrylic emulsion or as described in WO 2007/072162 a natural oil, such as linseed or calendula oil, or a fatty acid.

In one embodiment and in the examples described below, the binder used was a commercial screen printing ink base, comprising a water-based acrylic emulsion, and the solvent was propylene glycol.

Other binder and solvent combinations which have been shown to be suitable include: refined linseed oil with commercial lacquer thinners, acetone or similar; polystyrene with chloroform; and cellulous acetate butyrate with chloroform.

With the exception of devices in which the substrate forms one of the electrical contacts, it is preferred to produce the electrical contacts in a similar manner as the silicon layer, so that they are directly patterned by printing. For this purpose any commonly available conducting ink, such as silver, gold or graphite based screen printing pastes or metallic nanoparticle based inks, may be used.

Alternatively, the contacts may be formed by one of a number of established thin film deposition processes, such as sputtering, evaporation, or chemical vapour deposition. Equally, electroplating or electroless plating may be applied.

In such cases, the contacts may be patterned to the correct form by chemical or electrochemical etching, laser scribing or otherwise removing material to form the desired shape.

In one preferred embodiment, the contacts have a circular geometry so that the radial electrical path of the thermistor structure ensures that the resistance measured is averaged over all directions relative to the printing direction, thus eliminating the effect of any lateral anisotropy in the printing process.

Generally because of the high resistivity of the printed silicon material, the aspect ratio of the thermistor device should be low, so that the distance between any two contacts used to supply the current should be small in comparison to the width of the semiconducting pathway between the contacts.

Preferably, the aspect ratio of the thermistor device is less than 1/30, and more preferably less than 1/1 000.

Figure 1:
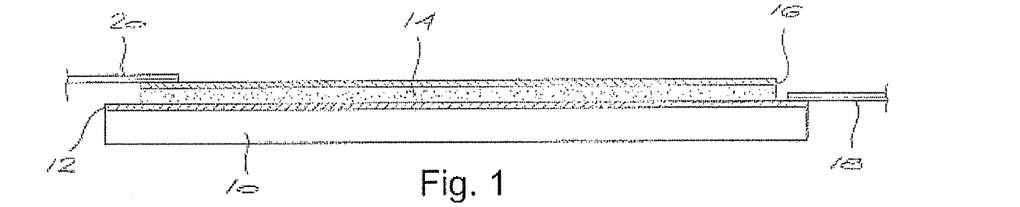
FIG. 1 is a schematic side view of a multi-layer temperature sensing device according to the present invention.

In one embodiment this can be achieved by a multilayer structure, comprising a layer of printed silicon material between two layers of conducting material, as illustrated in FIG. 1 of the accompanying drawings. In such a device the resistance is measured through the thickness of the silicon layer, in a direction perpendicular to the plane of the silicon layer. Consequently, the area of such a temperature sensor can be extended almost indefinitely and may take any arbitrary shape.

In general, however a series of coplanar electrodes or contacts are preferred because of the simplicity of the manufacturing process. In this case at least two conducting contacts are deposited using any suitable process either on to the silicon layer, or firstly onto the substrate and subsequently overprinted with the silicon layer. These two geometries may be referred to as top-contact or bottom-contact devices respectively.

For devices with coplanar contacts, the specific geometries indicated in FIGS. 2 to 8 below may be applied to increase the width to length ratio.

In one embodiment, two elongated parallel contacts which extend side by side are deposited in a pattern defining a spiral or meandering path to cover a relatively large area, thereby to allow the average temperature of a correspondingly shaped area of the substrate to be monitored In another embodiment, two interdigitated electrical contacts, each having a plurality of elongate strips or fingers which extend parallel and adjacent to one another to define a serpentine gap, are connected or bridged by a layer of printed particulate silicon.

The layer of printed particulate silicon may be structured to follow the serpentine gap between the electrodes, or may form a continuous layer over the serpentine gap between the electrodes.

In another embodiment, four electrical contacts, two of which are used to supply electrical current to the temperature sensing device and two of which are used to monitor voltage in use, are deposited in either a conventional linear four-point geometry or any of the commonly used van der Pauw geometries to obtain a higher accuracy.

The invention extends to a temperature sensing device produced by the above defined methods.

DESCRIPTION OF EMBODIMENTS

FIG. 1 shows a schematic sectional side view of a basic multi-layer thermistor structure according to an example embodiment of the present invention.

The thermistor structure is formed on a substrate 10 and comprises a first metallic layer 12, a layer of particulate silicon 14 printed onto the first metallic layer 14, and a second metallic layer 16 deposited onto the layer of particulate silicon 14. As indicated above, the substrate 10 can take many forms, but will typically comprise a flexible sheet, which may, for example, be composed of a solid film such as a metal foil or polymer sheet; a fibrous material such as paper and felted materials; or a woven fabric. These examples are provided merely for illustrative purposes and are not intended to be limiting. The metallic layers and the particulate silicon layer are preferably deposited by printing as defined above.

In the embodiment of FIG. 1, the substrate 10 is either non-conducting or, if conducting, does not serve as an electrical contact to the thermistor structure. In this embodiment, the first and second metallic layers 12 and 16 serve as conducting electrodes or contacts, to which respective wires or other conductors 18 and 20 can be connected.

Several example embodiments of thermistors produced by the methods of the invention are described below with reference to FIGS. 2 to 8.

Figure 2:
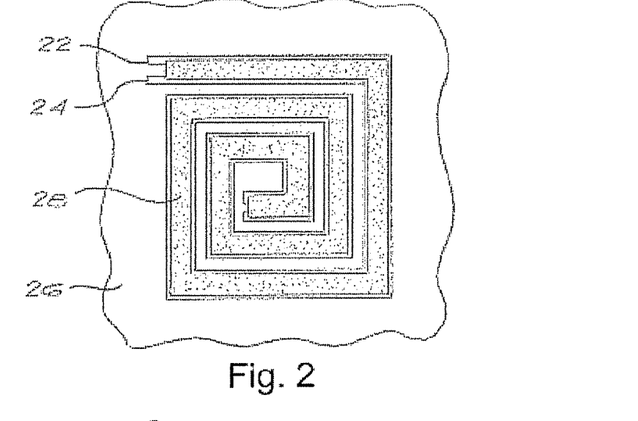
FIG. 2 is a schematic diagram showing the arrangement of a first embodiment of a printed thermistor according to the invention, with a spiral configuration.

The first embodiment, as shown in FIG. 2, is a bottom-contact two-terminal thermistor. This embodiment includes two elongate conducting contacts 22 and 24 formed on a substrate 26, which extend side by side and which may be arranged in a pattern such as a spiral to cover a relatively large area. The contacts are connected or bridged by a layer 28 of printed particulate silicon having an elongate spiral shape and which partially overlies the respective contacts, the whole structure being supported by the substrate. Electrical connections can be made to the contacts 22 and 24 as required.

Instead of the illustrated squared-off spiral shape, the contacts and the bridging layer of particulate silicon may follow another parallel meander or curved spiral path. The thermistor structure may cover a relatively large area, to allow the average temperature of a large and possibly irregularly shaped area of the substrate 26 (or an object to which the substrate 26 is attached) to be monitored.

A similar top contact device may be fabricated by simply reversing the deposition sequence, with the layer of particulate silicon being printed first and the contacts being deposited over it. In an alternative approach, the silicon strip may form a continuous layer deposited on or underneath the contact strips.

Figure 3:
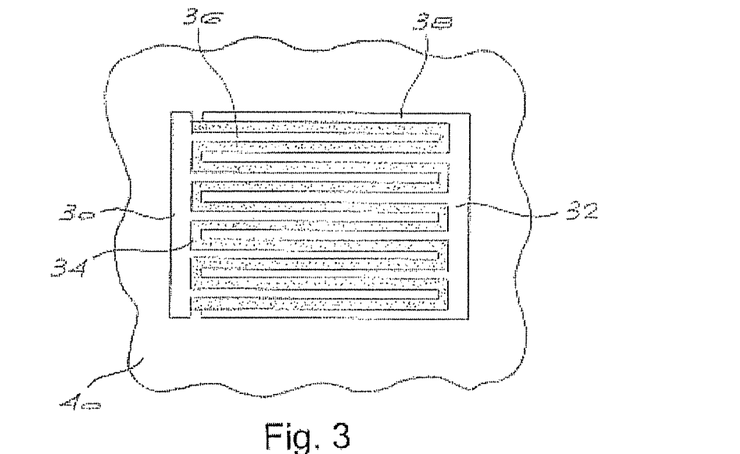
FIG. 3 is a schematic diagram showing the arrangement of a second embodiment of a printed thermistor according to the invention, with an interdigitated configuration.

FIG. 3 is an illustration of an interdigitated two terminal thermistor consisting of two interdigitated electrical contacts 30 and 32, which are connected or bridged by a layer 34 of printed particulate silicon. The contacts 30 and 32 each have a plurality of elongate strips or fingers 36 and 38 which extend parallel and adjacent to one another to define a serpentine gap over which a layer of silicon ink is printed to form the layer 34 and to connect the two sets of electrodes. The number and length of the contacts or electrodes and their fingers may be varied to cover any desired area. The thermistor is printed on a substrate 40.

This silicon layer 34 may be structured to follow the gaps between the electrodes as shown, or may form a continuous layer. The device may be either a bottom-contact or top-contact device, depending on the order of deposition of the materials as described above.

Figure 4:
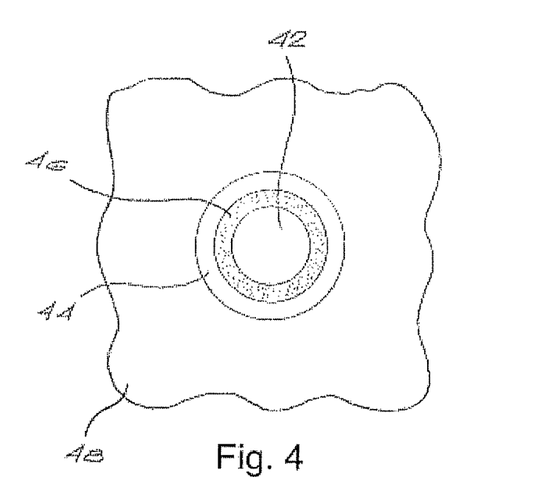
FIGS. 4 & 5 are schematic diagrams showing the arrangement of third and fourth embodiments of a printed thermistor according to the invention, with concentrically arranged contacts.

FIG. 4 shows an embodiment in which the electrical path of the thermistor is in the radial direction of a circular structure having an inner electrical contact 42 and a concentric ring-shaped outer contact or electrode 44. The contacts are connected by an annular layer of printed particulate silicon 46. The thermistor is printed on a substrate 48

Figure 5:
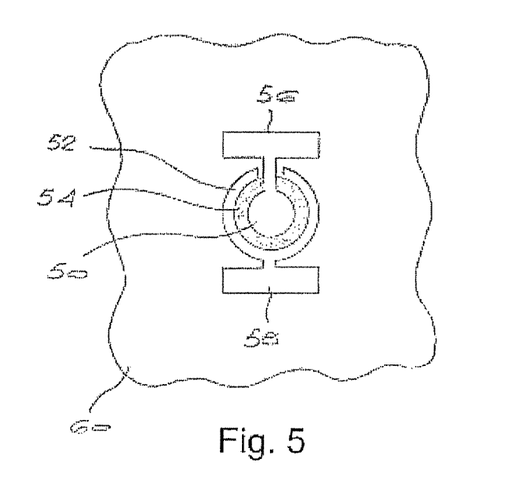

FIG. 5 shows a similar embodiment to that of FIG. 4, in which the two contacts comprise a solid inner circle 50 and a concentric outer ring 52 deposited in a coaxial geometry. A printed particulate silicon layer 54 forms a second concentric ring, bridging the two contacts. However, in the device of FIG. 5 the inner electrode contact 50 is extended radially outwardly to a first electrical contact pad through a gap in the outer contact 52. The outer contact is also extended outwardly to a second electrical contact pad 58. The structure is printed on a substrate 60. The concentric ring defined by the printed silicon layer 54, which bridges the annular gap between the two contacts, may be either complete or broken (as illustrated).

The example embodiments of FIGS. 4 and 5, which may be fabricated as either top-contact or bottom-contact devices, are specifically adapted to printing processes. The radial electrical path of these thermistor structures ensures that the resistance measured is averaged over all directions relative to the printing direction, thus eliminating the effect of any lateral anisotropy in the deposition process.

Figure 6:
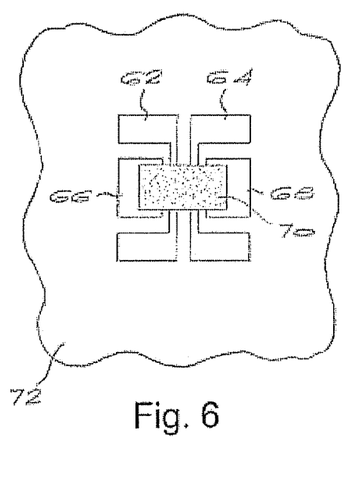
FIG. 6 is a schematic diagram showing the arrangement of a fifth embodiment of a printed thermistor according to the invention, having a four electrode configuration.

For higher accuracy, thermistor devices adapted for use in the well known four point resistance measurement technique may be desirable. This may be achieved by a device having four coplanar electrodes as indicated in FIG. 6. This device has two finely structured inner electrodes 62 and 64 between which the potential difference is determined and two additional electrodes 66 and 68 through which a current is supplied. All four electrodes are connected by an over-printed layer 70 of printed particulate silicon. The device is formed on a substrate 72. Each of the inner electrodes 62 and 64 has an enlarged contact pad at each end thereof.

The two inner electrodes 62 and 64 are used to measure the potential difference in the particulate silicon layer, and may be very finely printed. The outer electrodes 66 and 68 are used to supply an excitation current and may be relatively large compared to the inner electrodes. In the simplest variation of this geometry, as illustrated, the silicon layer 70 is simply printed as a thick strip bridging the four electrodes in a central area of the device.

Figure 7:
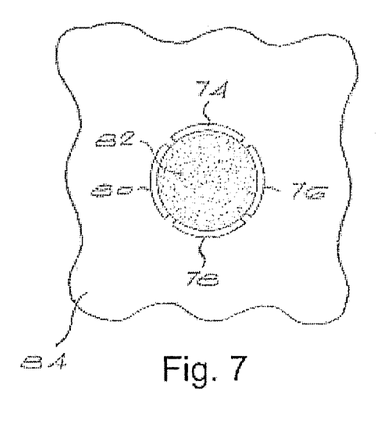
FIG. 7 is a schematic diagram showing the arrangement of a sixth embodiment of a printed thermistor according to the invention, having four electrical contacts connected by a layer of printed particulate silicon for which a van der Pauw method can be used to determine the electrical resistance.
Figure 8:
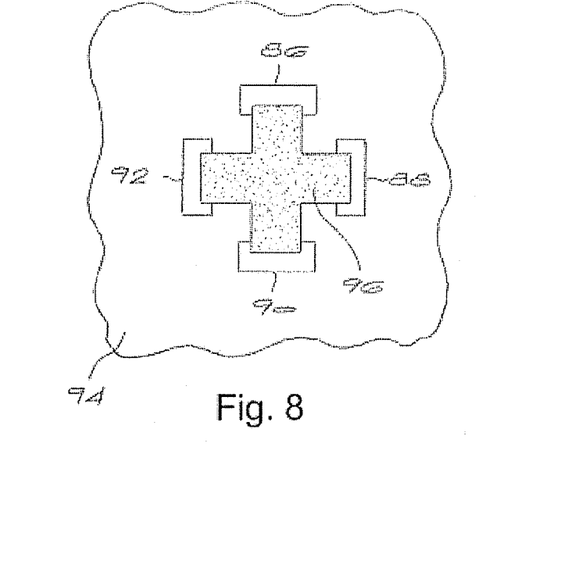
FIG. 8 is a schematic diagram showing the arrangement of a sixth embodiment of a printed thermistor according to the invention, similar to the embodiment of FIG. 7 but having extended contact arms.

An alternative to the four point resistance method is to use any of the well-known van der Pauw geometries, such as the circular design shown in FIG. 7 or the "Greek cross" geometry shown in FIG. 8.

In the printed thermistor device of FIG. 7, four equispaced wedge-shaped electrical contacts 74, 76, 78 and 80 are provided, connected by a layer 82 of printed particulate silicon having a solid circular shape. The device is printed on a substrate 84. The four contacts are arranged symmetrically in a circular pattern with a space in the centre of the pattern which is filled by the layer of printed silicon. To obtain the highest accuracy, this latter layer should have a circular form and be centrally located. However, this is not essential, and adequate devices can be produced by printing a continuous layer of silicon onto or underneath the electrodes.

In the device of FIG. 8, four electrodes 86, 88, 90 and 92 are deposited symmetrically on a substrate 94. A layer 96 of particulate silicon is deposited in a central region of the device between the contacts. The layer 96 has a Greek cross geometry, with the tips of the arms of the cross partially overlying the respective electrodes and defining two perpendicular silicon paths between the electrodes.

Further well known variations of the van der Pauw geometry which can be defined by thermistors of the invention include structures which combine the geometrical features of these two basic forms, such as a clover leaf or Maltese cross.

A novel method of determining the temperature dependent resistance, made possible by the use of printing to fabricate the devices, is to extend the principles of the van der Pauw technique by having the same symmetrical electrode structure forming top and bottom contacts. Any of the two-contact designs presented above can be used to determine the resistance through the bulk of the silicon layer in an analogous method to the standard four-point van der Pauw technique. Similarly, four-electrode configurations applied as both top and bottom contacts will give an even higher accuracy and stability of the resistance measurement.

Furthermore, any of the above designs, or similar arrangements of electrodes, can be arranged in an array over a large area on the substrate to form a pixellated sensor which will allow the temperature distribution over a given area to be mapped.

Example 1

In a first example a negative temperature coefficient thermistor was produced according to the design shown in FIG. 6. Four silver electrodes or contacts were deposited on 80 g/m$^2$ wood-free paper sheet substrate by screen-printing using Du Pont 5000 silver conductor. The separation between any two adjacent electrodes was 2 mm. After allowing the silver ink to dry for approximately one day under ambient conditions, silicon ink was drop-cast to form a connection between all four electrodes of the device. The silicon nanoparticles used in the ink were milled from a boron doped p-type silicon wafer, according to the method disclosed in WO 2009/125370. These particles were mixed with a commercially available acrylic screen-printing base in a ratio of 95% silicon by weight, and the consistency of the ink was adjusted by thinning with propylene glycol.

The completed device was cut out from the larger sheet of paper to form a small flexible device of size approximately 15 mm by 10 mm. In preliminary tests, the room temperature current/voltage characteristics were determined by both four-point and two-point techniques. For testing its temperature response, this device was fixed with adhesive tape to the outside of a glass beaker of diameter 65 mm, such that the paper substrate was between the printed thermistor device and the glass, and so that the axis of the device followed the circumference of the glass.

Figure 9:
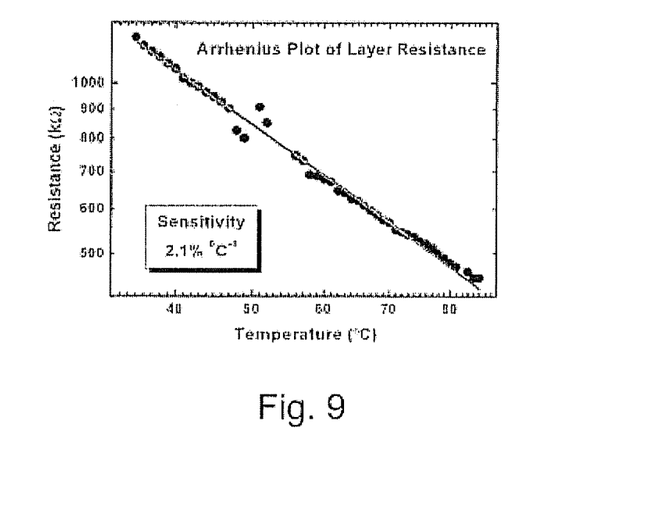
FIG. 9 is a graph showing an Arrhenius curve for an example of a thermistor of the design shown in FIG. 6.

To calibrate the temperature dependence of the resistance, the beaker was filled with iced water and heated on an electric hotplate, while the temperature of the water was measured with a digital thermometer. For convenience the resistance was simply measured with a digital multimeter. FIG. 9 shows the resistance temperature response of the thermistor on an Arrhenius scale. In the temperature range indicated, the device exhibits a logarithmic temperature coefficient, commonly referred to as a beta value, of 2 210±30K.

Example 2

In a second example a negative temperature coefficient thermistor was produced, also according to the design shown in FIG. 5. Silver contacts were deposited on a substrate comprising a sheet of 80 g/m² wood-free paper by screen-printing using Du Pont 5000 silver conductor. The diameter of the inner electrode was 5 mm, and the separation between the two electrodes was 0.5 mm. After allowing the silver ink to dry for approximately one day under ambient conditions, a silicon layer was screen-printed over the gap between the electrodes, using silicon nanoparticles milled from 2503 grade metallurgical silicon according to the method disclosed in WO 2009/125370. These nanoparticles were mixed with a commercially available acrylic screen-printing base in a ratio of 88% silicon by weight, and the consistency of the ink was adjusted by thinning with propylene glycol.

Figure 10:
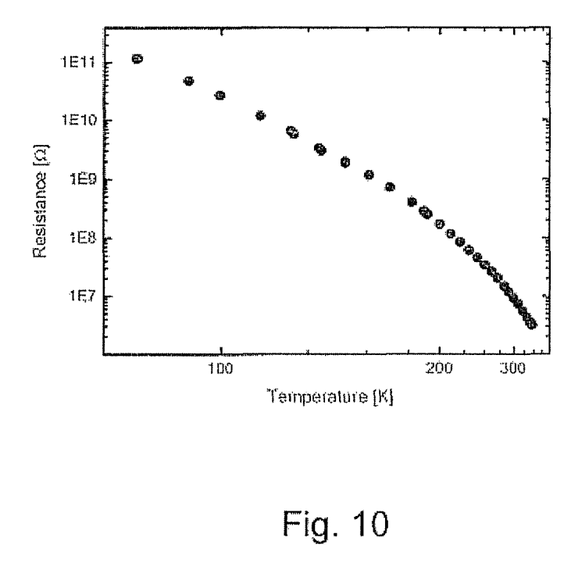
FIG. 10 is a graph showing an Arrhenius curve for an example of a bottom-contact thermistor of the design shown in FIG. 5.

The completed device was cut out from the larger sheet of paper to form a small flexible device of size approximately 20 mm by 15 mm. Silver wires were soldered to the contact pads to form secure permanent connections. Current/voltage characteristics were measured for the device, in the temperature range 50K to 350K, using a Lake Shore 7700 Hall measurement system, and associated cryostat, under zero magnetic field conditions. The resistance/temperature characteristics shown as an example in FIG. 10 were determined from the slope of the voltage/current characteristics at low excitation current. Over an extended temperature range, there are at least two Arrhenius coefficients, of typically 1 000K at liquid nitrogen temperatures and 2 000K around room temperature. Further studies of similar devices indicate a third beta value of approximately 10 000K which is apparent at temperatures above 350K. The combination of these different beta values in different ranges allows the printed silicon thermistors to be applied over a wide range of temperatures.

Example 3

Figure 11:
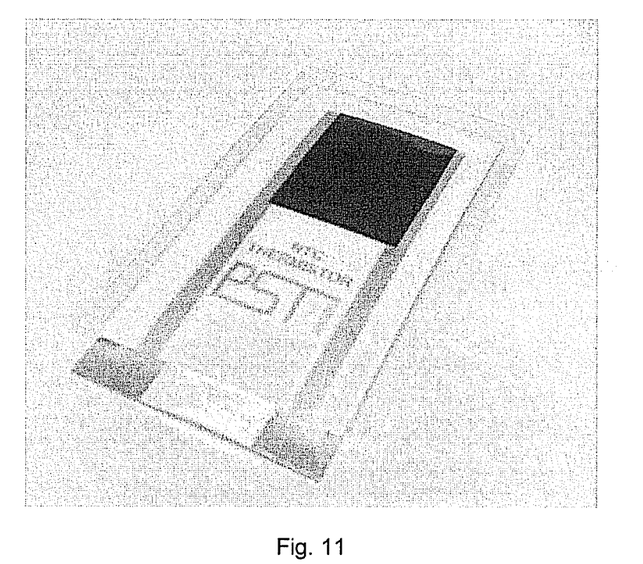
FIG. 11 is a photograph of an embodiment of a negative temperature coefficient thermistor formed according to the method of the invention.

FIG. 11 is a photograph of a negative temperature coefficient thermistor according to the design shown in FIG. 3. In this case the silicon is printed as a solid block over the interdigitated silver contacts, but only the area of silicon deposited between the contacts contributes to the temperature dependent resistance. For a low resistance, the length to width aspect ratio of the silicon semiconductor should be low, ideally less than 1/1 000. In this example, the silver contacts comprise 25 individual electrodes, with 24 gaps between adjacent electrodes, each gap having a length of 16 mm and the width of each gap (the separation between adjacent electrodes) of 0.25 mm.

In contrast to the device of Example 2, which is a high resistance device and has a length to width aspect ratio of approximately 1/30 (given by the ratio of the transverse gap between the conductors to the circumference of a circle defining the gap between the conductors in FIG. 5), the design of the present Example has an aspect ratio of 1/1 600, and a correspondingly lower resistance for the same silicon layer thickness.

The silver contacts were deposited by screen printing on 160 gsm paper board substrates using Du Pont 5000 Silver Conductor. After allowing the silver ink to dry for approximately one day under ambient conditions, a silicon layer was screen-printed over the gap between the electrodes, using silicon nanoparticles milled from 2503 grade metallurgical silicon according to the method disclosed in WO 2009/125370. These nanoparticles were mixed with a commercially available acrylic screen-printing base in a ratio of 80% silicon by weight, and the consistency of the ink was adjusted by thinning with propylene glycol.

The final thermistor was then packaged as a discrete component according to the method disclosed in South African provisional patent specification 2010/06533, with the silver contacts being allowed to protrude from the plastic lamination. Tests of many such devices were conducted in a box oven, over a temperature range from 20° C. to 60° C., yielding a consistent beta value of 2 000 K with a statistical variation of ±100 K. Typical resistances, depending on the thickness of the silicon layer, are 100 kΩ. Detailed analysis of the conductance from low temperature measurements using a Lake Shore 7700 system, over an extended temperature range from 15 K to 350 K, showed three characteristic beta values of approximately 20 K, 650 K and 1 900 K.

Example 4

Figure 12:
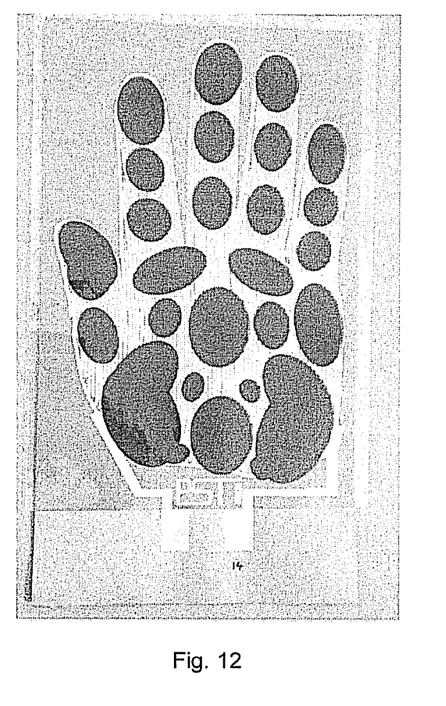
FIG. 12 is a photograph of a variation of the interdigitated thermistor shown in FIG. 11.

FIG. 12 is a photograph of variation of the interdigitated thermistor described in Example 3, according to the basic design of FIG. 3, which is extended over a larger area, and which takes its form as a graphic design. As an example a full size human handprint was chosen as the design, but any other abstract or pictorial design could have been selected without restriction.

A plurality of silver tracks, with their common connections forming the outline of the hand, are screen printed, using Du Pont 5000 silver conductor on various colours of 180 gsm paper board, to form the interdigitated electrodes. The gaps between the electrodes are adjusted to fit the shape of the design, and range from 0.5 mm to 1 mm. Silicon ink, comprising 80% by weight of nanoparticles milled from 2503 grade silicon according to the method disclosed in WO 2009/125370, is printed in different positions to form both the graphic design and a set of thermistors connected in parallel. Equally the whole area of the hand could have been printed in silicon, but this was not done to allow an illustration of the principles of construction and operation of the thermistor. After printing, the thermistor was packaged as a discrete component according to the method disclosed in South African provisional patent specification 2010/06533, with the silver contacts being allowed to protrude from the plastic lamination. Typical resistances for this design, depending on the thickness of the silicon layer, are between 20 and 40 kΩ, and the beta value is consistent at 2 000±100 K.

The invention claimed is:

1. A method of producing a temperature sensing device, the method including forming at least one silicon layer and at least one electrode or contact to define a thermistor structure, at least the silicon layer being formed by printing, and at least one of the silicon layer and said at least one electrode or contact being supported by a substrate during printing thereof, wherein the silicon layer is formed from an ink comprising silicon particles and a liquid vehicle composed of a binder and a suitable solvent, the silicon particles having a size in the range of 10 nanometers to 100 micrometers and a surface that allows the transport of electrical charge between the particles, the transfer of the electrical charge between individual particles or clusters of particles being limited by thermally activated processes; and wherein the overall transport of electrical current through the silicon layer follows a percolation path between interconnecting particles and clusters of particles such that the nominal, or room temperature, resistivity is governed in part by the microstructure of the silicon layer, which is modified by the addition of at least one additional conducting path into the silicon article layer by the modification of the ink composition, by varying the silicon to binder ratio or the addition of either an insulating phase of silica or ceramic nanoparticles or a conducting or semiconducting phase to the ink, thereby effectively to add a substantially temperature independent internal resistance in parallel with the temperature dependent resistance of the thermistor structure.

2. The method of claim 1 wherein said at least one electrode or contact is formed by printing.

3. The method of claim 1 wherein said at least one silicon layer and at least two conducting electrodes or contacts are applied directly to an object of which the temperature is to be measured, so that the object itself forms the substrate for the thermistor structure.

4. The method of claim 1 wherein the substrate comprises an electrically conducting body, so that the substrate forms an electrode or contact of the thermistor structure.

5. The method of claim 1 wherein the substrate comprises a flexible sheet.

6. The method of claim 5 wherein the flexible sheet comprises a solid film, a fibrous material or a woven fabric.

7. The method of claim 1 wherein the substrate comprises a rigid sheet.

8. The method of claim 7 wherein the rigid sheet comprises a solid material, a composite containing fibrous or particulate material or a composite containing woven fabric.

9. The method of claim 1 wherein the substrate forms a temporary support or template for the thermistor structure during the production thereof.

10. The method of claim 9 wherein the substrate is sacrificial, and is removed by chemical, thermal or mechanical means after printing of the thermistor structure.

11. The method of claim 9 wherein the substrate forms a reusable template.

12. The method of claim 1 including printing an internal substantially temperature independent resistor, using a conducting ink, in parallel with the temperature dependent resistance of the thermistor structure, to decrease the nominal resistance of the printed temperature sensor.

13. The method of claim 1 including printing an internal substantially temperature independent resistor, using a conducting ink, in series with the temperature dependent resistance of the thermistor structure, to increase the nominal resistance of the printed temperature sensor.

14. The method of claim 1 wherein the silicon particle fraction in the ink is in the range from 5% to 95%.

15. The method of claim 14 including adjusting the resistance of the printed temperature sensor by varying the fraction of silicon particles in the ink within the range of 25% to 60% of silicon particles by volume.

16. The method of claim 14 wherein the ink has a silicon particle fraction above 60% and preferably above 80%.

17. The method of claim 1 including forming at least one of the conducting electrodes or contacts by printing using a conducting ink, by a thin film deposition process, or by electroplating or electroless plating.

18. The method of claim 17 including the step of patterning said at least one contact to the correct form by chemical or electrochemical etching, laser scribing or otherwise removing material to form the desired shape.

19. The method of claim 1 wherein the contacts have a circular geometry so that the radial electrical path of the thermistor structure ensures that the resistance measured is averaged over all directions relative to the printing direction, thus eliminating the effect of any lateral anisotropy in the printing process.

20. The method of claim 1 wherein the aspect ratio of the thermistor device is less than 1/30, so that the distance between any two contacts used to supply current to the thermistor device is small in comparison to the width of the semiconducting pathway between the contacts.

21. The method of claim 20 wherein the aspect ratio of the thermistor device is less than 1/1000.

22. The method of claim 1 wherein two elongated parallel contacts which extend side by side are deposited in a pattern defining a spiral or meandering path to cover a relatively large area, thereby to allow the average temperature of a correspondingly shaped area of the substrate to be monitored.

23. The method of claim 1 wherein two interdigitated electrical contacts, each having a plurality of elongate strips or fingers which extend parallel and adjacent to one another to define a serpentine gap, are connected or bridged by a layer of printed particulate silicon.

24. The method of claim 23 wherein the layer of printed particulate silicon is structured to follow the serpentine gap between the electrodes.

25. The method of claim 23 wherein the layer of printed particulate silicon forms a continuous layer over the serpentine gap between the electrodes.

26. The method of claim 1 wherein four electrical contacts, two of which are used to supply electrical current to the temperature sensing device and two of which are used to monitor voltage in use, are deposited in either a conventional linear four-point geometry or any of the commonly used van der Pauw geometries to obtain a higher accuracy.

* * * * *